(12) United States Patent
Hong et al.

(10) Patent No.: US 7,675,154 B2
(45) Date of Patent: Mar. 9, 2010

(54) RF MODULE WITH MULTI-STACK STRUCTURE

(75) Inventors: Seog-woo Hong, Yongin-si (KR); In-sang Song, Seoul (KR); Byeong-ju Ha, Seongnam-si (KR); Hae-seok Park, Yongin-si (KR); Jun-sik Hwang, Yongin-si (KR); Joo-ho Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 11/634,247

(22) Filed: Dec. 6, 2006

(65) Prior Publication Data

US 2007/0170565 A1 Jul. 26, 2007

(30) Foreign Application Priority Data

Jan. 25, 2006 (KR) .................. 10-2006-0007905

(51) Int. Cl.
- H01L 23/02 (2006.01)
- H01L 23/34 (2006.01)
- H01L 23/48 (2006.01)
- H01L 23/52 (2006.01)
- H01L 29/40 (2006.01)

(52) U.S. Cl. .................. 257/686; 257/685; 257/723; 257/725; 257/777; 257/E23.001

(58) Field of Classification Search ......... 257/685–686, 257/723, 725, 777, E23.001
See application file for complete search history.

(56) References Cited

U.S. PATENT DOCUMENTS

| | | | |
|---|---|---|---|
| 5,751,555 A * | 5/1998 | Pfizenmayer et al. ....... 361/763 |
| 5,874,321 A * | 2/1999 | Templeton et al. .......... 438/107 |
| 6,094,588 A * | 7/2000 | Adam ........................ 505/210 |
| 6,271,056 B1 * | 8/2001 | Farnworth et al. .......... 438/106 |
| 6,607,934 B2 * | 8/2003 | Chang et al. ................ 438/50 |
| 6,657,523 B2 * | 12/2003 | Tarui et al. ................. 333/246 |
| 6,734,539 B2 * | 5/2004 | Degani et al. .............. 257/686 |
| 6,872,893 B2 * | 3/2005 | Fukuoka et al. ............ 174/255 |
| 6,982,480 B2 * | 1/2006 | Shi ............................ 257/687 |
| 6,985,712 B2 * | 1/2006 | Yamakawa et al. ......... 455/333 |
| 7,080,446 B2 * | 7/2006 | Baba et al. .................. 29/832 |
| 7,205,177 B2 * | 4/2007 | De Raedt et al. ........... 438/108 |
| 7,312,505 B2 * | 12/2007 | Kipnis et al. ............... 257/415 |
| 2002/0041218 A1 * | 4/2002 | Tonegawa et al. .......... 333/193 |
| 2002/0044030 A1 * | 4/2002 | Uchikoba ................... 333/193 |
| 2004/0173894 A1 * | 9/2004 | Glenn et al. ................ 257/693 |
| 2004/0217264 A1 * | 11/2004 | Wood et al. ............. 250/214 R |
| 2006/0012021 A1 * | 1/2006 | Larson et al. .............. 257/686 |
| 2006/0102374 A1 * | 5/2006 | Heide ....................... 174/52.4 |
| 2006/0119001 A1 * | 6/2006 | Thummel ............... 264/272.14 |
| 2007/0023203 A1 * | 2/2007 | Leizerovich et al. ........ 174/255 |
| 2007/0123949 A1 * | 5/2007 | Dabney et al. ............... 607/37 |

* cited by examiner

Primary Examiner—Ida M Soward
(74) Attorney, Agent, or Firm—Sughrue Mion, PLLC

(57) ABSTRACT

A radio frequency (RF) module and a multi RF module including the same include a base substrate, a first element capable of processing RF signals formed on the base substrate, a second element capable of processing RF signals separated from and disposed over the first element, a cap substrate coupled with the base substrate to encapsulate the first and second elements including a plurality of through electrodes that electrically connect the first and second elements to the outside, and a bonding pad that encapsulates and joins the base substrate and the cap substrate and electrically connects the first and second elements to the through electrodes.

8 Claims, 10 Drawing Sheets

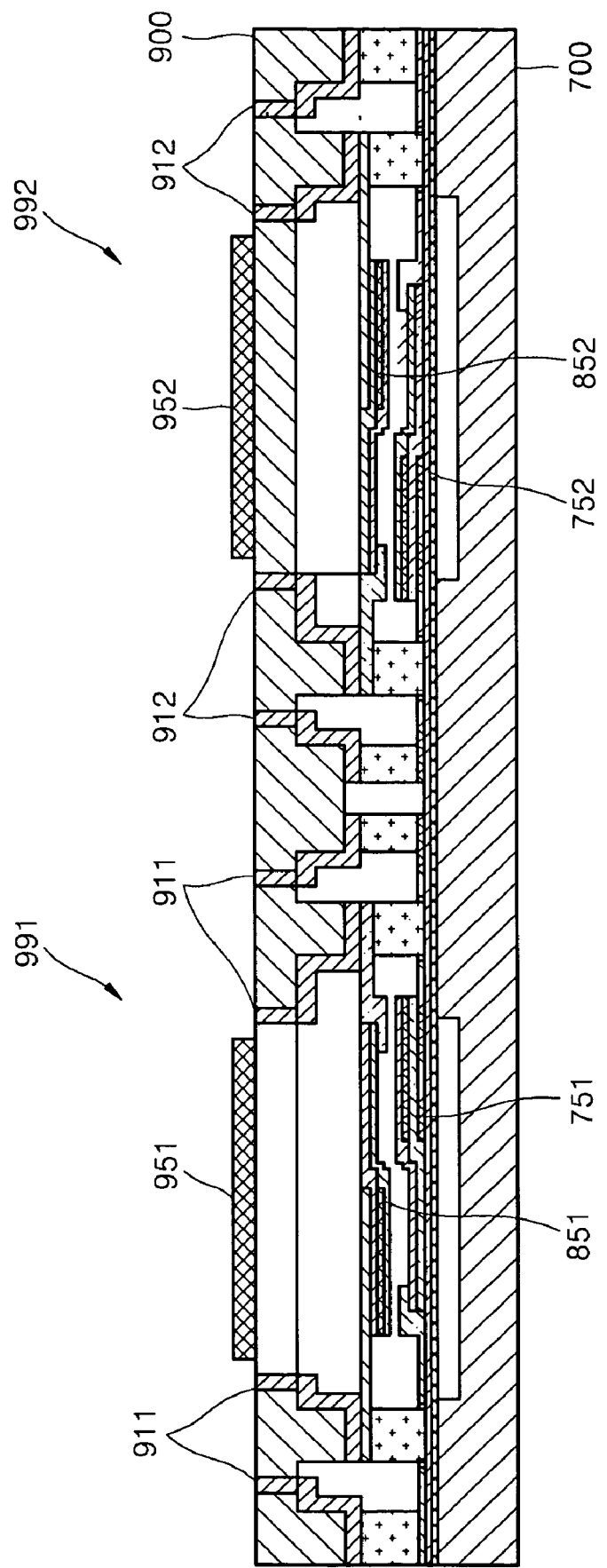

RF MODULE WITH MULTI-STACK STRUCTURE

CROSS-REFERENCE TO RELATED PATENT APPLICATION

This application claims priority from Korean Patent Application No. 10-2006-0007905, filed on Jan. 25, 2006 in the Korean Intellectual Property Office, the disclosure of which is incorporated herein in its entirety by reference.

BACKGROUND OF THE INVENTION

1. Field of the Invention

The present invention relates to a radio frequency (RF) module, a multi RF module including the RF module, and a method of fabricating the RF module, and more particularly, to an RF module with a multi stack structure which can be manufactured on a wafer, a multi RF module including the RF module, and a method of fabricating the RF module.

2. Description of the Related Art

Radio frequency (RF) refers to frequency used for wireless communication. An RF module processes RF signals, that is, it generates and receives wireless signals. Examples of RF modules are a filter bank constituted of a filter and a phase shifter or the like, a duplexer, a dual duplexer, etc. The filter bank includes a plurality of modulation filters transmitting wireless signals formed by a plurality of RF modules in a predetermined frequency band. Also, the duplexer uses several filters in various ways to properly divide RF signals sent and received through an antenna.

Many wireless communication devices such as cell phones are required to be small and light. However, since RF elements of such communication devices are manufactured separately and then integrated on a substrate, the manufacturing process is complicated and it is difficult to reduce the size of the devices.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

Methods and apparatuses consistent with the present invention provide an RF module which can be manufactured on a wafer by packaging a plurality of elements in a single chip, a multi RF module including the RF module, and manufacturing the RF module.

According to an aspect of the present invention, there is provided an RF module that may include a base substrate; a first element for processing RF signals formed on the base substrate; a second element for processing RF signals separated from and disposed over the first element; a cap substrate coupled with the base substrate to encapsulate the first and second elements and includes a plurality of through electrodes that electrically connect the first and second elements to the outside; and a bonding pad that encapsulates and joins the base substrate and the cap substrate and electrically connects the first and second elements to the through electrodes.

The multi RF module may include a plurality of the RF modules and the RF modules may be formed together on the base substrate.

According to another aspect of the present invention, there is provided a method of manufacturing an RF module, which may include forming a first element for processing RF signals on a base substrate; forming a second element for processing RF signals on a middle substrate; bonding the base substrate and the middle substrate so that the first and second elements face each other; etching the middle substrate such that wiring of the first and second elements is exposed; forming on a cap substrate a third element for processing RF signals and a through electrode which electrically connects the first and second elements to the outside; and encapsulating and bonding the base substrate and the cap substrate so that the first and second elements are encapsulated.

According to another aspect of the present invention, there is provided a method of manufacturing an RF module, which may include forming on a base substrate first and third elements for processing RF signals; forming on a cap substrate a second element for processing RF signals and a through electrode which electrically connects the first and second elements to the outside; encapsulating the first and second elements by joining the base substrate and the cap substrate; and etching the cap substrate such that the third element is exposed to the outside.

BRIEF DESCRIPTION OF THE DRAWINGS

The above and other aspects of the present invention will become more apparent by describing in detail exemplary embodiments thereof with reference to the attached drawings in which:

FIG. 3 is a cross-sectional view of an RF module according to another exemplary embodiment of the present invention;

DETAILED DESCRIPTION OF THE EXEMPLARY EMBODIMENTS

The present invention will now be described more fully with reference to the accompanying drawings, in which exemplary embodiments of the invention are shown.

Figure 1:
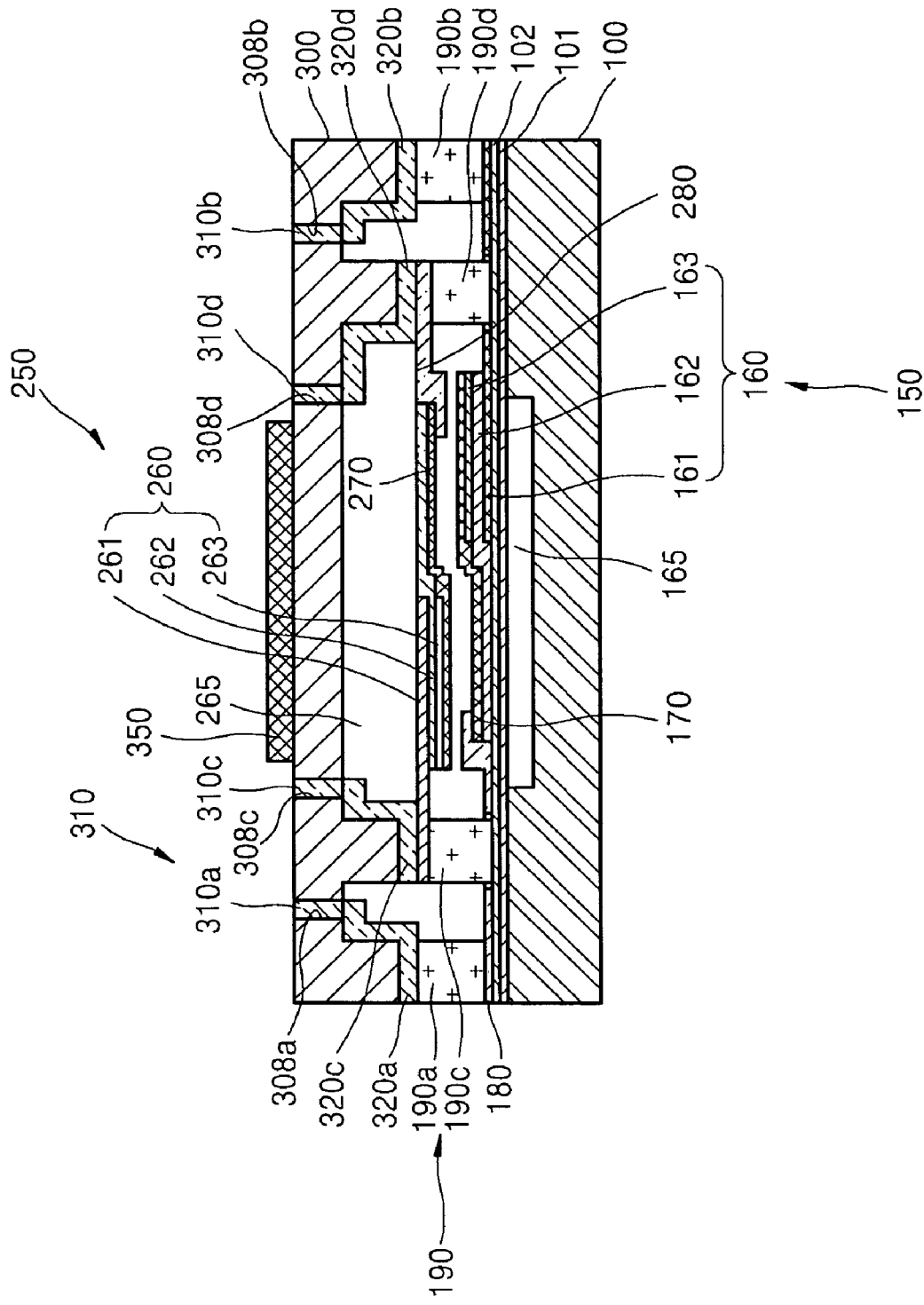
FIG. 1 is a cross-sectional view of an RF module according to an exemplary embodiment of the present invention.

FIG. 1 is a cross-sectional view of a radio frequency (RF) module according to an exemplary embodiment of the present invention.

Referring to FIG. 1, the RF module is a multi stack type having several elements disposed at various layers and a chip scale packaging structure manufactured on a wafer. The RF module may include a base substrate 100, a first element 150 disposed on the base substrate 100, a second element 250 disposed at an interval on the first element 150, a cap substrate 300 coupled with the base substrate 100 and encapsulates the first and second elements 150 and 250, a third element 350 disposed on the cap substrate 300, and a bonding pad 190 encapsulating and joining the base substrate 100 and the cap substrate 300.

The base substrate 100 may be a silicon substrate. As the first element 150 has a filter function and is disposed on the base substrate 100, the base substrate 100 may preferably be a high resistive silicon (HRS) for reducing insertion loss of RF signals in a high frequency band.

An insulating layer 101 and a dielectric layer 102 may be interposed between the base substrate 100 and the first element 150. The insulating layer 101 insulates the base substrate 100 and the first element 150 electrically and may be formed of $SiO_2$ or $Al_2O_3$. The dielectric layer 102 reduces the insertion loss of RF signals in the high frequency band and may be formed, for example, of AlN.

Also, a first cavity 165 may be formed in the area where the first element 150 is disposed on the base substrate 100 for improving the RF characteristic of the first element 150. The first cavity 165 may be formed using a sacrificial material.

The cap substrate 300 may be a general silicon substrate. The cap substrate 300 is coupled with the base substrate 100 and encapsulates the first and second elements 150 and 250 in order to prevent external effects on the first and second elements 150 and 250. A second cavity 265 is formed on the cap substrate 300, and the second element 250 is separated from the cap substrate 300. The second cavity 265 improves the RF characteristic of the second element 250.

The cap substrate 300 includes a plurality of via holes 308a-308d. The via holes 308a-308d are filled with a conductive metal to form through electrodes 310 that electrically connect the first and second elements 150 and 250 to the outside. Also, a third element 350 is formed in the upper portion of the cap substrate 300 and is connected electrically to the first and second elements 150 and 250 by the through electrodes 310 and contact pads 320a-320d that are formed on the cap substrate 300.

The bonding pad 190 includes first and second bonding pads 190a and 190b which encapsulate and join the margin of the base substrate 100 and the margin of the cap substrate 300 and third and fourth bonding pads 190c and 190d supporting the second element 250. The bonding pad 190 is formed of a conductive material such as a metal and electrically connects the first and second elements 150 and 250 and the through electrodes 310. As the first and second elements 150 and 250 are connected using the bonding pad 190, and the first and second elements 150 and 250 disposed in the upper and lower portions are electrically connected without using via holes, the manufacturing process of the RF module can be simplified and yield can be improved.

The first through third elements 150, 250, and 350 process RF signals and the RF module according to the exemplary embodiment of the present embodiment can be used as a duplexer.

The first and second elements 150 and 250 in the exemplary embodiment form a band-pass filter passing only signals in a predetermined frequency band.

The first element 150 includes at least a film bulk acoustic resonator (FBAR) 160. In FIG. 1, an air gap type FBAR 160 having excellent resonance characteristics is illustrated as a first element 150.

The first FBAR 160 is formed by depositing a first lower electrode 161, a piezoelectric layer 162, and a first upper electrode 163 sequentially on the base substrate 100.

The first FBAR 160 is supported by the insulating layer 101 and the dielectric layer 102 and disposed on the first cavity 165 formed on the base substrate 100. The first cavity 165 refers to an air gap which improves resonance. The first cavity 165 can be formed using a sacrificial material.

The first lower electrode 161 and the first upper electrode 163 are formed of a general conductive material such as a metal. For example, the first lower electrode 161 and the first upper electrode 163 can be respectively formed Al, W, Au, Pt, Ni, Ti, Cr, Pd, or Mo.

The first piezoelectric layer 162 is formed of a material generating piezoelectric phenomenon such as AlN or ZnO. When a signal is applied between the first lower electrode 161 and the first upper electrode 163 from the outside, electric energy is transmitted to the first piezoelectric layer 162 which is disposed therebetween, and a portion of the transmitted electric energy is changed into mechanical energy by the piezoelectric effect. When the mechanical energy is changed into electric energy again, the first piezoelectric layer 162 resonates with the frequency of the natural vibration according to its thickness. The first FBAR 160 transmits only the signals in a predetermined frequency band using this resonance.

The first element 150 is formed of a plurality of first FBARs 160 connected to the patterned first lower electrode 161 and the patterned first upper auxiliary electrode 170. The first element 150 can tune the frequency pass band minutely using the first upper auxiliary electrode 170. Also, the first element 150 may be formed of a plurality of FBARs connected serially or in parallel in order to adjust the frequency pass band. The first lower electrode 161 is electrically connected to a second through electrode 310b through the second bonding pad 190b and the second contact pad 320b, and the first upper electrode 163 is electrically connected to the first through electrode 310a through the first upper auxiliary pad 170, the first conductive pad 180, the first bonding pad 190a, and the first contact pad 320a.

The second FBAR 260 which forms the second element 250 has a similar configuration as the first FBAR 160, and thus a detailed description thereof will not be repeated and only differences thereof will now be described.

The second FBAR 260 is formed by depositing a second lower electrode 261, a second piezoelectric layer 262, and a second upper electrode 263 sequentially on a middle substrate 200 in FIGS. 4A, which will be described later, and the middle substrate 200 is etched and removed during the manufacturing process.

The second element 250 is supported by the third and fourth bonding pads 190c and 190d so as to be separated from the first element 150 and the cap substrate 300. The distance between the second element 250 and the first element 150 may be in the range from 1 through 10 μm such that the first and second elements 150 and 250 are prevented from interfering with each other or sticking to each other during resonance.

The second cavity 265 formed between the second lower electrode 261 and the cap substrate 300 refers to an air gap which improves the resonance. The second cavity 265 can be manufactured not using a sacrificial material, but by an ordinary etching process, and thus the manufacturing process thereof is simple.

The second element 250 is formed of a plurality of second FBARs 260 which are connected to the patterned second lower electrode 261 and a patterned second upper auxiliary electrode 270. The lower electrode 261 is electrically connected to a third through electrode 310c through a third contact pad 320c, and the second upper electrode 263 is electrically connected to a fourth through electrode 310d through the second upper auxiliary electrode 270, the second conductive pad 280, and the fourth contact pad 320d.

The third element 350 is a phase shifter for insulation of the first and second elements 150 and 250 and is disposed in the upper portion of the cap substrate 300. The third element 350 is formed of an inductor and a capacitor, and is electrically connected to the first and second elements 150 and 250 through the through electrodes 310 formed on the cap substrate 300, thereby creating phase differences among the RF signals.

Figure 2:
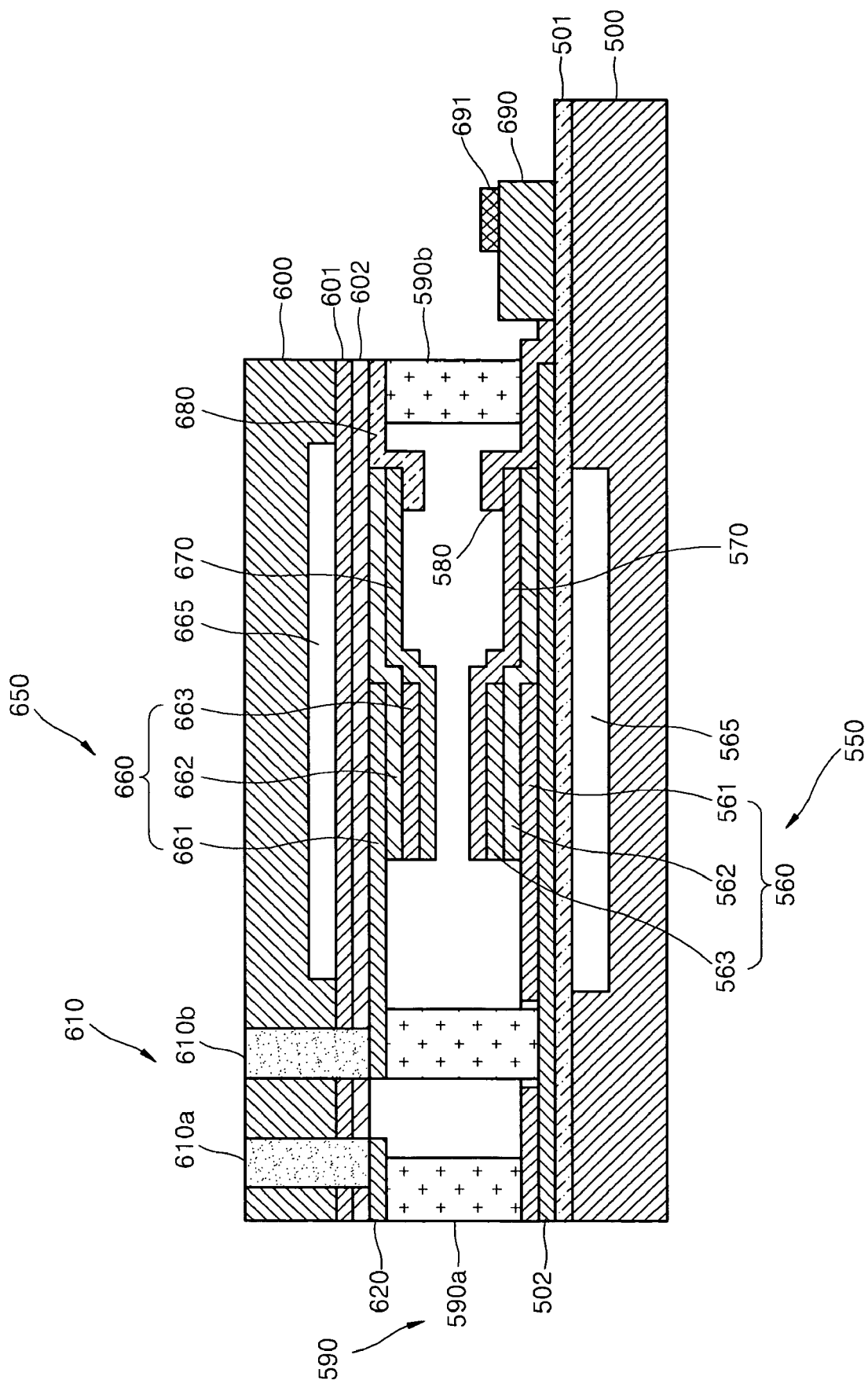
FIG. 2 is a cross-sectional view of an RF module according to another exemplary embodiment of the present invention.

FIG. 2 is a cross-sectional view of an RF module according to another exemplary embodiment of the present invention.

Referring to FIG. 2, the RF module includes a base substrate 500, a first element 550 and a third element 690 that are separated on the base substrate 500, a second element 650 separated a predetermined distance from and disposed on the first element 550, a cap substrate 600 that is coupled with the base substrate 500 and encapsulates the first and second elements 550 and 650, and a bonding pad 590 that encapsulates and joins the base substrate 500 and the cap substrate 600. The RF module in the exemplary embodiment is distinguished from the RF module of FIG. 1 in that the third element 690 is formed directly on the margin of the base substrate 500 next to the area that is encapsulated and joined by the cap substrate 600, and the second element 650 is formed on the cap substrate 600.

A first FBAR 560 forming the first element 550 is formed by depositing the first lower electrode 561, the first piezoelectric layer 562, and the first upper electrode 563 sequentially on the base substrate 500. The first FBAR 560 is supported by an insulating layer 501 and a dielectric layer 502 and is disposed on the first cavity 565 formed on the base substrate 500.

The first element 550 is formed of a plurality of the first FBARs 560 connected to the patterned first lower electrode 561 and the patterned first upper auxiliary electrode 570. The first lower electrode 561 is electrically connected to the first through electrode 610a through the first bonding pad 590a and the contact pad 620. The first upper electrode 563 is electrically connected to the third element 690 through the first upper auxiliary electrode 570 and the first conductive pad 580.

A second FBAR 660 forming the second element 650 is disposed on a lower surface of the cap substrate 600 facing the base substrate 500. The second FBAR 660 is formed on the cap substrate 600, which is different from the RF module of FIG. 1. Reference numerals 601 and 602 respectively denote an insulating layer and a dielectric layer. The second cavity 665 can be formed of a sacrificial material.

The second FBAR 660 has a structure in which the second lower electrode 661, the second piezoelectric layer 662, and the second upper electrode 663 are sequentially stacked. The second element 650 is formed of a plurality of second FBARs 660 connected to a patterned second lower electrode 661 and a patterned second upper auxiliary electrode 670. The second lower electrode 661 is electrically connected to the second through electrode 610b, and the second upper electrode 663 is electrically connected to the third element 690 through the second upper auxiliary electrode 670, the second conductive pad 680, the third bonding pad 590b, and the first conductive pad 580.

The third element 690 in the exemplary embodiment is electrically connected to the first and second elements 550 and 560 through the first conductive pad 580. Reference numeral 691 denotes an electrode pad of the third element 690.

The cap substrate 600 includes a plurality of through electrodes 610 connecting the first and second elements 550 and 650 to the outside. In the exemplary embodiment, a wiring portion is arranged also through the first conductive pad 580 formed on the base substrate 500.

FIG. 3 is a cross-sectional view of a multi RF module according to an exemplary embodiment of the present invention.

Referring to FIG. 3, the multi RF module includes a first RF module 991 and a second RF module 992 formed on one base substrate 700.

First and second elements 751 and 851 of the first RF module 991 and first and second elements 752 and 852 of the second RF module 992 are encapsulated by a cap substrate 900, and third element 951 of the first RF module 991 and third element 952 of the second RF module 992 are formed on the upper surface of the cap substrate 900. The first and second RF modules 991 and 992 are electrically connected to the outside by through electrodes 911 and 912 formed on the cap substrate 900. The first and second RF modules 991 and 992 in the exemplary embodiment are similar to the RF module of FIGS. 1 and 2, and thus the detailed description thereof will not be repeated.

As two RF modules are integrated in the multi RF module in the exemplary embodiment, if the RF modules are respectively a duplexer, the multi RF module can also function as a dual duplexer where transmission and reception of signals is performed in a two channel frequency band.

The multi RF module in the exemplary embodiment includes two integrated RF modules, however, it is not limited to two modules. For example, when a plurality of frequency band filters are required, the multi RF module may include two or more RF modules and function as a filter bank.

The above-described multi RF module can be manufactured with a plurality of RF modules as a single unit on a base substrate, thereby increasing the manufacturing yield, and the size thereof can be reduced to a chip scale size.

Hereinafter, a method of manufacturing an RF module according to the exemplary embodiments of the present invention will be described with reference to the attached drawings.

FIGS. 4A through 4F illustrate a method of manufacturing the RF module described with reference to FIG. 1 according to an exemplary embodiment of the present invention.

Figure 4A:
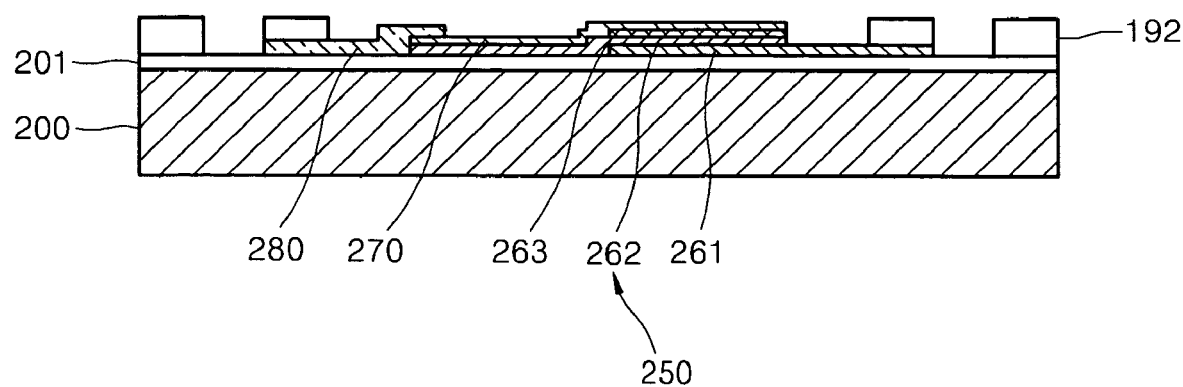
FIGS. 4A through 4F illustrate a method of manufacturing the RF module of FIG. 1.
Figure 4B:
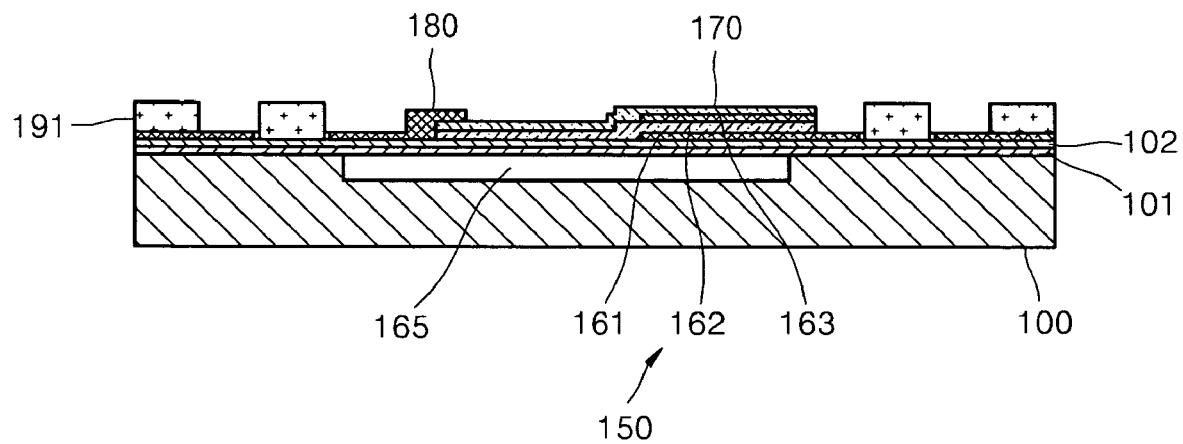

Referring to FIGS. 4A and 4B, a first element 150 processing RF signals is formed on a base substrate 100, and a second element 250 processing RF signals is formed on a middle substrate 200. The first and second elements 150 and 250 can be formed by ordinary thin layer process.

For example, the surface of the base substrate 100 may be etched to form a sacrificial layer (not shown) and polished using a polishing process such as chemical mechanical polishing (CMP). Then, an insulating layer 101, a dielectric layer 102, a first lower electrode 161, a first piezoelectric layer 162, a first upper electrode 163, a first upper auxiliary electrode 170, a first conductive pad 180, and a first metal layer 191 are sequentially evaporated. Next, the sacrificial layer is removed using via holes to form a first cavity 165, and thus a first element 150 can be realized on the base substrate 100.

Likewise, an etching resistive layer 201, a second lower electrode 261, a second piezoelectric layer 262, a second upper electrode 263, a second upper auxiliary electrode 270, a second conductive pad 280, and a second metal layer 292 are sequentially evaporated on the middle substrate 200, and thus a second element 250 can be realized on the middle substrate 200.

Figure 4C:
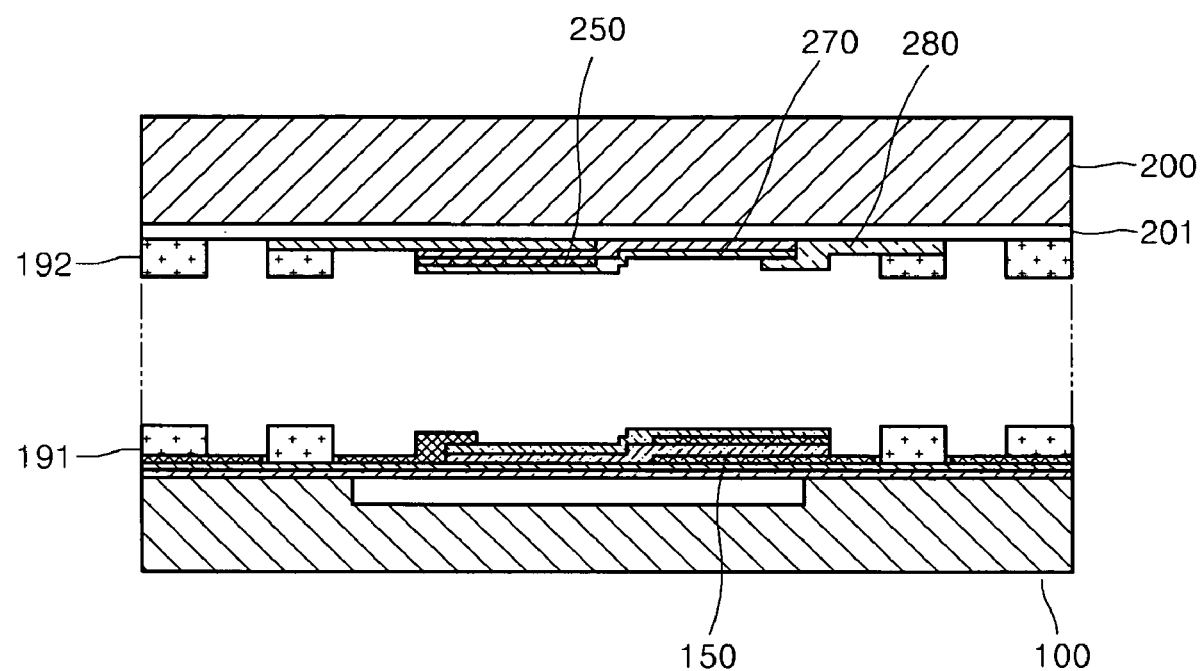

Referring to FIG. 4C, the base substrate 100, in which the first element 150 is formed, and the middle substrate 200, in which the second element 250 is formed, are bonded. The first metal layer 191 and the second metal layer 192 are joined to each other to form a bonding pad 190 (see FIG. 1) that encapsulates and bonds the base substrate 100 and the cap substrate 300. The bonding of the first metal layer 191 and the second metal layer 192 can be achieved, for example, by eutectic bonding, which is performed at a relatively low temperature and enables easy electrical connecting through the bonding surfaces.

Figure 4D:
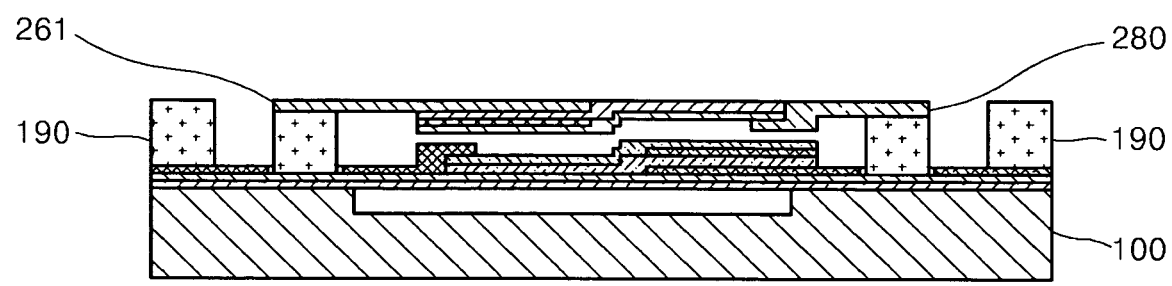

Referring to FIG. 4D, the middle substrate 200 and the etching resistive layer 201 (see FIG. 4C) are sequentially etched so that wiring of the first and second elements 150 and 250 (see FIGS. 4A and 4B, respectively) is exposed. As frequency band tuning is possible according to the degree of etching of the etching resistive layer 201, the final yield can be improved. Since the middle substrate 200 is removed during the manufacturing process, the middle substrate 200 may be an ordinary silicon substrate instead of an expensive high resistive silicon substrate, thereby reducing the manufacturing cost.

Figure 4E:
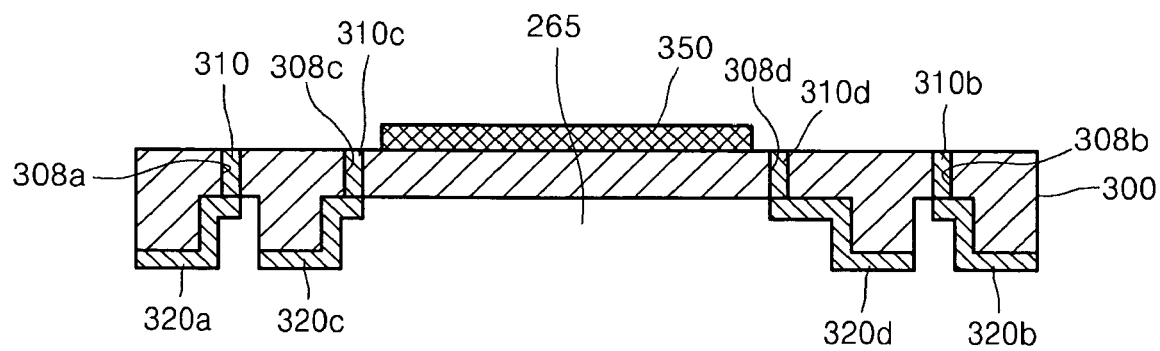

Next, referring to FIG. 4E, a cap substrate 300 is manufactured and a third element 350 is formed on the cap substrate 300. The cap substrate 300 is etched to form a second cavity 265, and the contact pads 320a-320d are patterned. Then the via holes 308a-308d are etched and filled with a metal using the contact pads 320a-320d as a seed layer to form through electrodes 310a-310d. Then, a third element 350 is formed on the surface opposite to the surface where the second cavity 265 of the cap substrate 300 is formed. The third element 350 can be formed by an ordinary thin layer process.

Since the second cavity 265 may be formed by etching the cap substrate 300 and not using an additional sacrificial material, the manufacturing process thereof can be simple. Furthermore, as the forming process of the second element 250 and the forming process of the second cavity 265 are separated, the second element 250 can be prevented from being chemically damaged due to the etching operation, which is necessary when forming the second cavity 265.

Figure 4F:
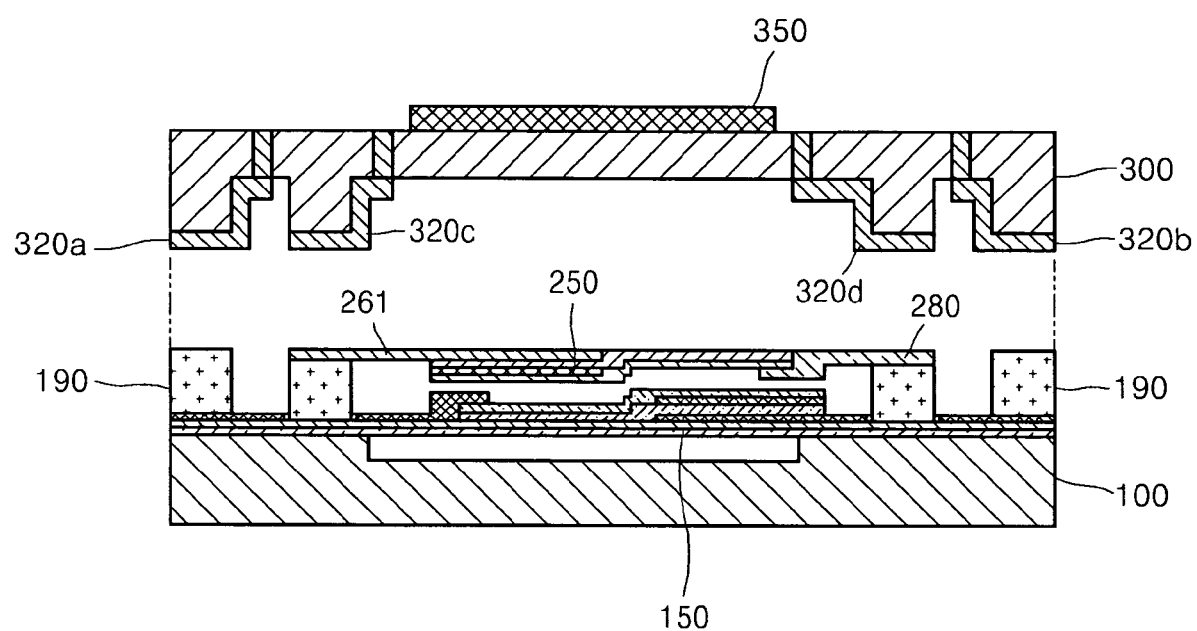

Next, referring to FIG. 4F, the RF module of FIG. 1 is completed by encapsulating and joining the upper surface of the base substrate 100 and the lower surface of the cap substrate 300 such that the first and second elements 150 and 250 are encapsulated. The bonding pad 190 formed on the base substrate 100 is bonded to the first contact pad 320a and the second contact pad 320b. And the second lower electrode 261 and the second conductive pad 280 are bonded to the third contact pad 320a and the fourth contact pad 320b respectively. The bonding can be performed, for example, by eutectic bonding.

Figure 5A:
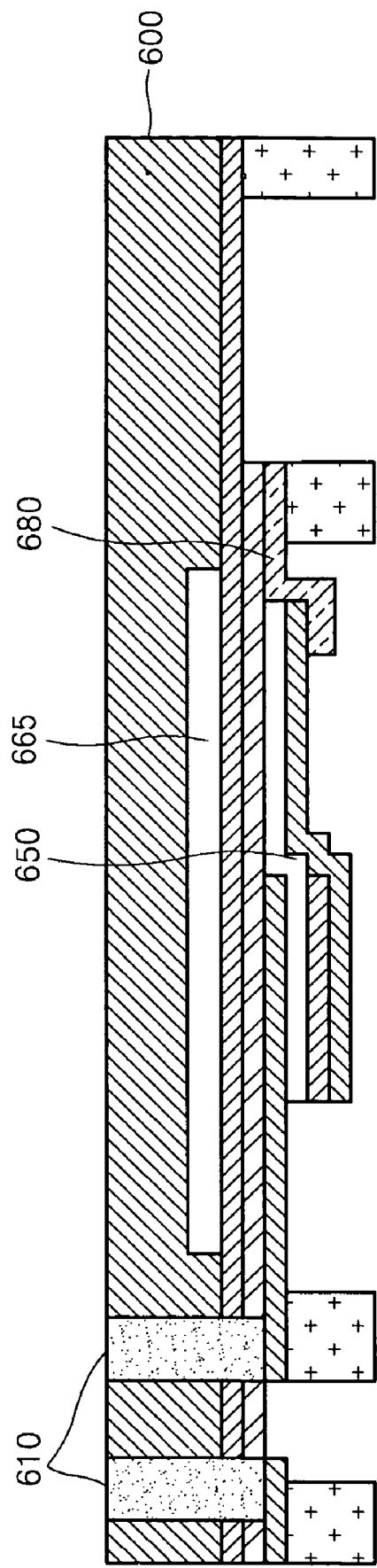
FIGS. 5A through 5C illustrate a method of manufacturing the RF module of FIG. 2.
Figure 5B:
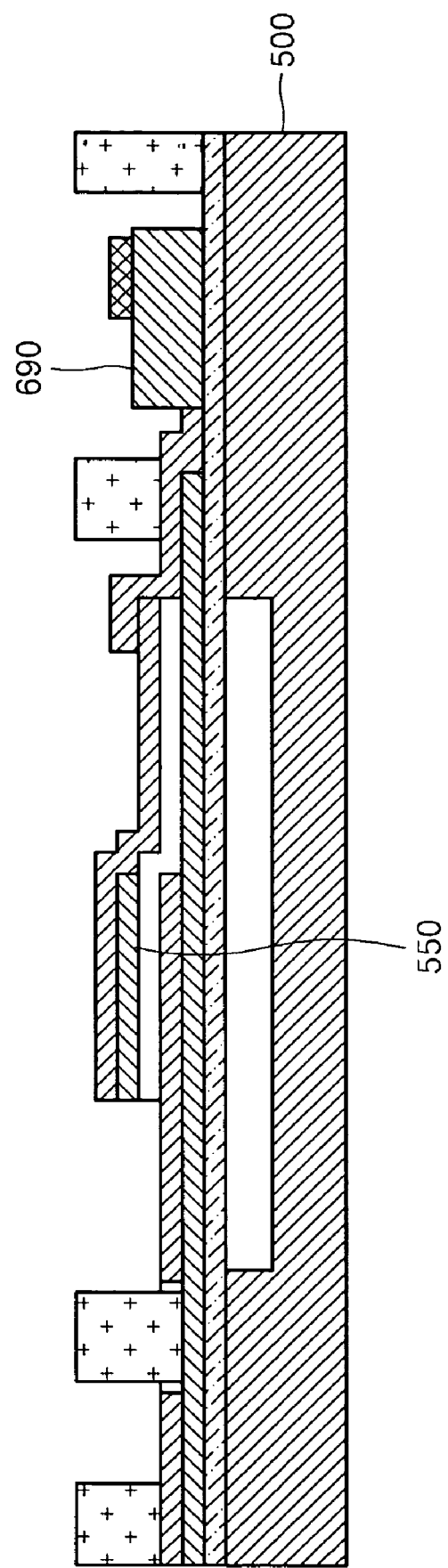
Figure 5C:
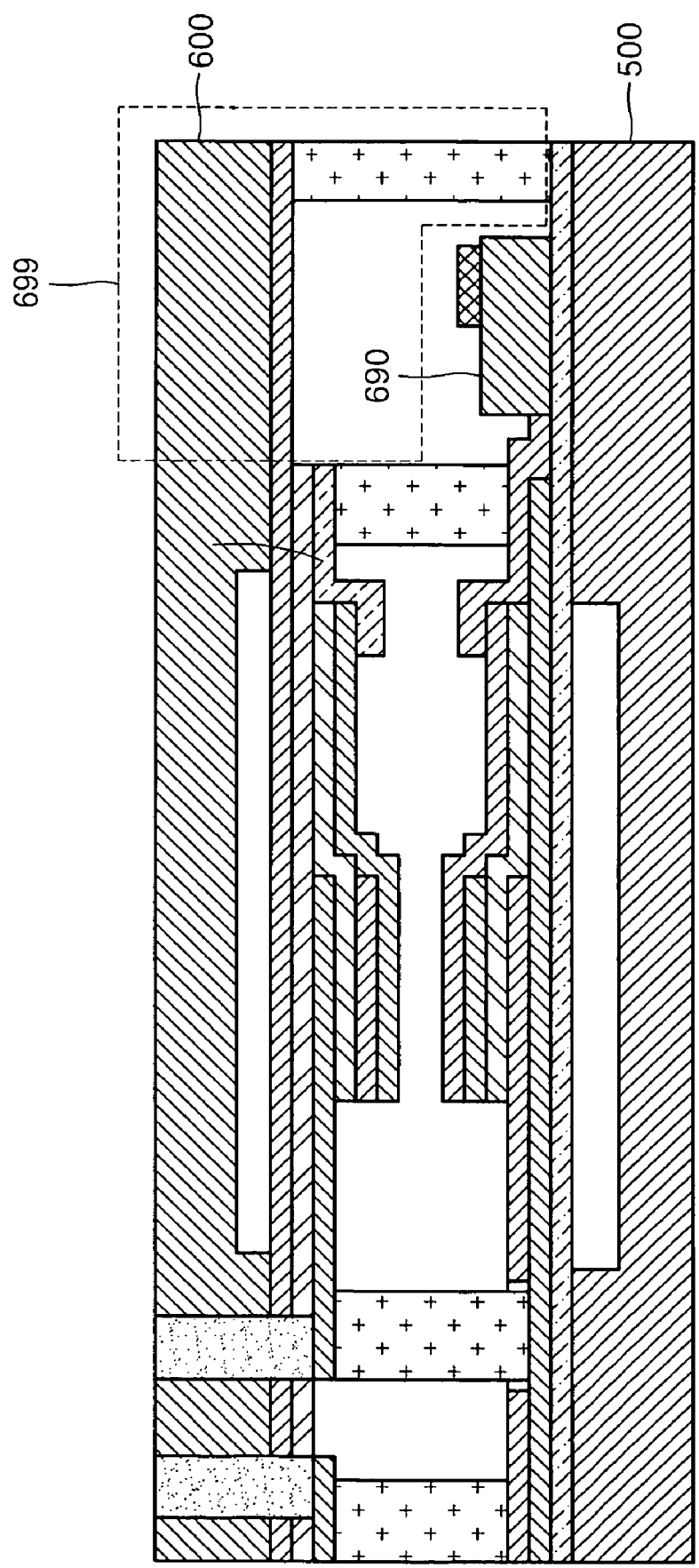

FIGS. 5A through 5C illustrate a method of manufacturing the RF module of FIG. 2 according to another exemplary embodiment of the present invention.

Referring to FIGS. 5A and 5B, first and third elements 550 and 690 are formed on a base substrate 500 and a second element 650 and a through electrode 610 are formed on a cap substrate 600. The second element 650 in the exemplary embodiment is directly formed on the cap substrate 600 without forming a middle substrate. A second cavity 665 can be formed using a sacrificial material.

Next, referring to FIG. 5C, the base substrate 500 and the cap substrate 600 are joined such that the first and second elements 550 and 650 are encapsulated, and after joining, a portion of the cap substrate 600 covering the third element 690 is etched so that the third element 690 is exposed, thus completing the RF module as illustrated in FIG. 2. Compared to the manufacturing method of the RF module of FIGS. 1 and 4A through 4F, the RF module in this exemplary embodiment is manufactured by one bonding process.

The RF module in exemplary embodiments the present invention can be manufactured in a chip scale packaging structure on a wafer. Furthermore, a plurality of RF modules can be manufactured on the wafer at the same time, and thus the multi RF module can also be manufactured simultaneously on the wafer. As the RF modules can be manufactured on the wafer, the yield thereof can be improved.

In the above described exemplary embodiments, the air gap type FBAR or the phase shifter are examples of elements processing RF signals, and other elements like RF switches can also be integrated.

As described above, the RF module, the multi RF module including the RF module, and the method of manufacturing the RF module according to exemplary embodiments the present invention may have the following effects.

First, the RF module can be manufactured on a wafer, thereby improving the yield thereof.

Second, the RF module is packaged in a chip scale, and thus can easily have a small size.

Third, wiring is arranged by the bonding pad, thereby reducing the number of the through electrodes and improving the yield thereof While the RF module, the multi RF module, and the method of manufacturing the same of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A radio frequency (RF) module comprising:
   a base substrate;
   a first element that is disposed on the base substrate and processes RF signals;
   a second element that is separated from and disposed over the first element within a same cavity as the first element and processes RF signals;
   a cap substrate coupled with the base substrate to encapsulate the first and second elements, the cap substrate comprising a plurality of through electrodes that electrically connect the first and second elements to the outside; and
   bonding pad that encapsulates and joins the base substrate and the cap substrate and electrically connects the first and second elements to the through electrodes,
   wherein each of the first and second elements comprises a band-pass filter.

2. The RF module of claim 1, wherein each of the first and second elements comprises at least one film bulk acoustic resonator (FBAR).

3. A radio frequency (RF) module comprising:
   a base substrate;
   a first element that is disposed on the base substrate and processes RF signals;
   a second element that is separated from and disposed over the first element within a same cavity as the first element and processes RF signals;
   a cap substrate coupled with the base substrate to encapsulate the first and second elements, the cap substrate comprising a plurality of through electrodes that electrically connect the first and second elements to the outside;
   bonding pad that encapsulates and joins the base substrate and the cap substrate and electrically connects the first and second elements to the through electrodes; and
   a third element that is disposed on the cap substrate, connected to the first and second elements by the through electrodes, and processes RE signals,
   wherein each of the first and second elements comprises a band-pass filter.

4. A radio frequency (RF) module comprising:
   a base substrate;
   a first element that is disposed on the base substrate and processes RF signals;
   a second element that is separated from and disposed over the first element within a same cavity as the first element and processes RF signals;
   a cap substrate coupled with the base substrate to encapsulate the first and second elements, the cap substrate comprising a plurality of through electrodes that electrically connect the first and second elements to the outside;

a bonding pad that encapsulates and joins the base substrate and the cap substrate and electrically connects the first and second elements to the through electrodes; and a third element that is disposed on the cap substrate, connected to the first and second elements by the through electrodes, and processes RF signals, wherein the third element comprises a phase shifter that separates the RF signals of the first and second elements from each other.

5. A radio frequency (RF) module comprising:

base substrate;

a first element that is disposed on the base substrate and processes RF signals;

a second element that is separated from and disposed over the first element within a same cavity as the first element and processes RF signals;

a cap substrate coupled with the base substrate to encapsulate the first and second elements, the cap substrate comprising a plurality of through electrodes that electrically connect the first and second elements to the outside;

bonding pad that encapsulates and joins the base substrate and the cap substrate and electrically connects the first and second elements to the through electrodes; and a third element that is disposed on the margin of the area that is encapsulated and joined by the cap substrate in the upper portion of the base substrate, connected to the first and second element, and processes RF signals, wherein the second element is disposed on a lower surface of the cap substrate facing the base substrate, and wherein each of the first and second elements comprises a band-pass filter.

6. A radio frequency (RF) module comprising:

a base substrate;

a first element that is disposed on the base substrate and processes RF signals;

a second element that is separated from and disposed over the first element within a same cavity as the first element and processes RF signals;

a cap substrate coupled with the base substrate to encapsulate the first and second elements, the cap substrate comprising a plurality of through electrodes that electrically connect the first and second elements to the outside;

a bonding pad that encapsulates and joins the base substrate and the cap substrate and electrically connects the first and second elements to the through electrodes; and a third element that is disposed on the margin of the area that is encapsulated and joined by the cap substrate in the upper portion of the base substrate, connected to the first and second element, and processes RF signals, wherein each of the first and second elements comprises a band-pass filter.

7. A radio frequency (RF) module comprising:

a base substrate;

a first element that is disposed on the base substrate and processes RF signals;

a second element that is separated from and disposed over the first element within a same cavity as the first element and processes RF signals;

a cap substrate coupled with the base substrate to encapsulate the first and second elements, the cap substrate comprising a plurality of through electrodes that electrically connect the first and second elements to the outside;

a bonding pad that encapsulates and joins the base substrate and the cap substrate and electrically connects the first and second elements to the through electrodes; and a third element that is disposed on the margin of the area that is encapsulated and joined by the cap substrate in the upper portion of the base substrate, connected to the first and second element, and processes RF signals, wherein the third element comprises a phase shifter which separates the RF signals of the first and second elements from each other.

8. A multi radio frequency (RF) module comprising:

a plurality of RF modules which are disposed on a base substrate wherein, each of the RF modules comprises:

a first element that is disposed on the base substrate and processes RF signals;

a second element that is separated from and disposed over the first element within a same cavity and processes RF signals;

a cap substrate that is bonded with the base substrate and encapsulates the first and second elements, and comprises a plurality of through electrodes that electrically connect the first and second elements to the outside; and a bonding pad that encapsulates and couples the base substrate and the cap substrate and electrically connects the first and second elements to be electrically connected to the through electrodes, wherein each of the first and second elements comprises a band-pass filter.

* * * * *